United States Patent
Suitou et al.

(10) Patent No.: US 7,352,638 B2
(45) Date of Patent: Apr. 1, 2008

(54) METHOD AND APPARATUS FOR TESTING A MEMORY DEVICE

(75) Inventors: Katsutoshi Suitou, Kawasaki (JP); Yoshichika Nakaya, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 107 days.

(21) Appl. No.: 11/362,318

(22) Filed: Feb. 23, 2006

(65) Prior Publication Data

US 2006/0242490 A1 Oct. 26, 2006

Related U.S. Application Data

(63) Continuation of application No. PCT/JP2005/002889, filed on Feb. 23, 2005.

(51) Int. Cl.
*G11C 7/00* (2006.01)

(52) U.S. Cl. .......... 365/200; 365/201
(58) Field of Classification Search .......... 365/200, 365/201
See application file for complete search history.

(56) References Cited

U.S. PATENT DOCUMENTS

| 6,288,940 B1 | 9/2001 | Kawamura | |
| 6,295,237 B1 * | 9/2001 | Pochmuller | 365/201 |
| 6,438,044 B2 * | 8/2002 | Fukuda | 365/200 |
| 6,728,910 B1 * | 4/2004 | Huang | 714/711 |
| 2003/0072204 A1 | 4/2003 | Shiga et al. | |
| 2003/0117886 A1 | 6/2003 | Shiga et al. | |
| 2004/0109371 A1 | 6/2004 | Tsukidate et al. | |

FOREIGN PATENT DOCUMENTS

| JP | 2001-195892 | 7/2001 |
| JP | 2003-077293 | 3/2003 |
| JP | 2003-257190 | 9/2003 |
| JP | 2004-102143 | 4/2004 |
| JP | 2004-103143 | 4/2004 |

\* cited by examiner

*Primary Examiner*—Connie C. Yoha
(74) *Attorney, Agent, or Firm*—Ingrassia, Fisher & Lorenz, P.C.

(57) ABSTRACT

The extension sector enable signal RS_SEL is a test target control signal for switching a test target between ordinary sectors and redundant sectors. During the test period of redundant sectors, if the defective redundant sector signal RSECF is at a HIGH level (that is, the selected redundant sector is a defective sector), the compulsory signal FMATCH is brought to a HIGH level. The match signal MATCH is forcedly brought to a HIGH level (S22) in compliance with the compulsory signal FMATCH which is at a HIGH level (S21:T). And, verification (S2a) is skipped for the defective sectors, whereby the address signal for identifying the ordinary memory blocks may be utilized for identification of redundant memory blocks.

16 Claims, 6 Drawing Sheets

METHOD AND APPARATUS FOR TESTING A MEMORY DEVICE

CROSS-REFERENCES TO RELATED APPLICATIONS

This is a continuation application of International Application No. PCT/JP2005/002889 filed Feb. 23, 2005, which was not published in English under PCT Article 21(2).

TECHNICAL FIELD

The present invention relates to testing a memory device having a redundant configuration, and, in particular, it relates to testing a redundant configuration of a memory device for redundancy recovery before the use of such memory device.

BACKGROUND

Background Art

In a memory circuit such as that disclosed in Japanese Unexamined Patent Application Publication No. 2004-103143 (hereinafter referred to as "Patent Document 1") at Paragraph No. 0081 and others, a redundancy judgment circuit generates a redundancy judgment signal for a matched state regardless of an address in the redundant memory in response to a test signal, thereby enabling access to a spare sector. Even prior to writing a redundant address in the redundant memory, accessing the spare sector is enabled so that a test of the spare sector can be conducted.

Problems to be Solved by the Invention

The above-described background art enables accessing a spare (redundant) sector by inputting a test signal prior to writing a redundant address. Although a test signal is required for a test of a redundant sector, no disclosure is provided for supply of the test signal in the above-described background art, and it is unclear how the test signal is supplied.

Where a test is conducted by an external testing device, a test signal is supplied from external to the memory circuit (memory device). In this case, the memory device is provided with a terminal exclusively dedicated to receive the test signal.

In recent years, in line with large scale and high integration of memory capacity, a memory device provided with a built-in self-test (hereinafter called "BIST") function has been proposed. That is, the memory device provides a self-diagnosis feature by which a test of the memory device can be independently conducted by a built-in control circuit. Carrying out a test utilizing this BIST function is problematic since no test signal can be received from external to the memory device.

Also, where the BIST function is incorporated internal to the memory device, although it is necessary to generate a test signal by a built-in control circuit, conditions and timing for generating a test signal are not disclosed in the above-described background art.

SUMMARY OF THE INVENTION

Means for Solving the Problems

The invention was developed to solve at least one of the problems of the background art, and it is therefore an object of the present invention to provide a method for testing a memory device, and a memory device, which are capable of conducting, by a built-in self-test function, a test for a redundant memory block, to which identifying information responsive to an address signal is not allocated, as a memory space for normal access.

To achieve the above-mentioned objective, there is provided a method for testing a memory device that includes an ordinary memory block and a redundant memory block wherein the test is conducted by using a built-in self-testing function, the method comprising the steps of generating an address signal for identifying the ordinary memory block and contents thereof, outputting a test target control signal, selecting the redundant memory block as a test target in the test by the built-in self-testing function in response to the test target control signal, and identifying the redundant memory block and contents thereof in accordance with the address signal after the step of selecting the redundant memory block as the test target.

With the method for testing a memory device in accordance with the present invention, in a memory device including an ordinary memory block and a redundant memory block, an address signal for identifying an ordinary memory block and the contents thereof is generated when conducting a test in response to a built-in self-testing function, a test target control signal for selecting a redundant memory block as a test target at the time of testing the redundant memory block is outputted, and the redundant memory block and contents thereof in response to an address signal are identified.

The memory device in accordance with the present invention includes an ordinary memory block and a redundant memory block and conducts a test by using a built-in self-testing function, the memory device comprising an address sequencer which generates an address signal for identifying the ordinary memory block and contents thereof, and a test target control section which outputs a test target control signal for substituting identification of the redundant memory block and contents thereof for the address signal during the test of the redundant memory block.

With the memory device in accordance with the present invention which includes an ordinary memory block and a redundant memory block, when conducting a test in accordance with a built-in self-testing function, an address signal for identifying the ordinary memory block and contents thereof is generated by an address sequencer, and a test target control signal for selecting a redundant memory block as a test target is outputted by the test target control section when conducting a test of a redundant memory block.

Accordingly, with respect to a redundant memory block, not forming a memory space at the time of normal access to which an address signal for identifying an ordinary memory block is not allocated, it is possible to select a redundant memory block as a test target by a test target control signal during a test of the redundant memory block. The address signal for identifying an ordinary memory block may be utilized for identification of the redundant memory block. When conducting a test of the redundant memory block, it is not necessary to carry out any control such as inputting a test signal from external to the memory device, wherein it is possible to conduct a test of a redundant memory block by the built-in self-testing function.

Effects of the Invention

In accordance with the present invention, at the time of testing the redundant memory block, it is not necessary to input a test signal from external to the memory device, wherein it is not necessary to provide any exclusive input terminal. In the memory device capable of conducting a test by the built-in self-testing function, it becomes possible to conduct a test of a redundant memory block in addition to a test of an ordinary memory block.

DETAILED DESCRIPTION OF THE INVENTION

Hereinafter, a detailed description is given of an embodiment of a method for testing a memory device, and an embodiment of the memory device in accordance with the present invention with reference to the drawings based on FIG. 1 through FIG. 8.

Figure 1:
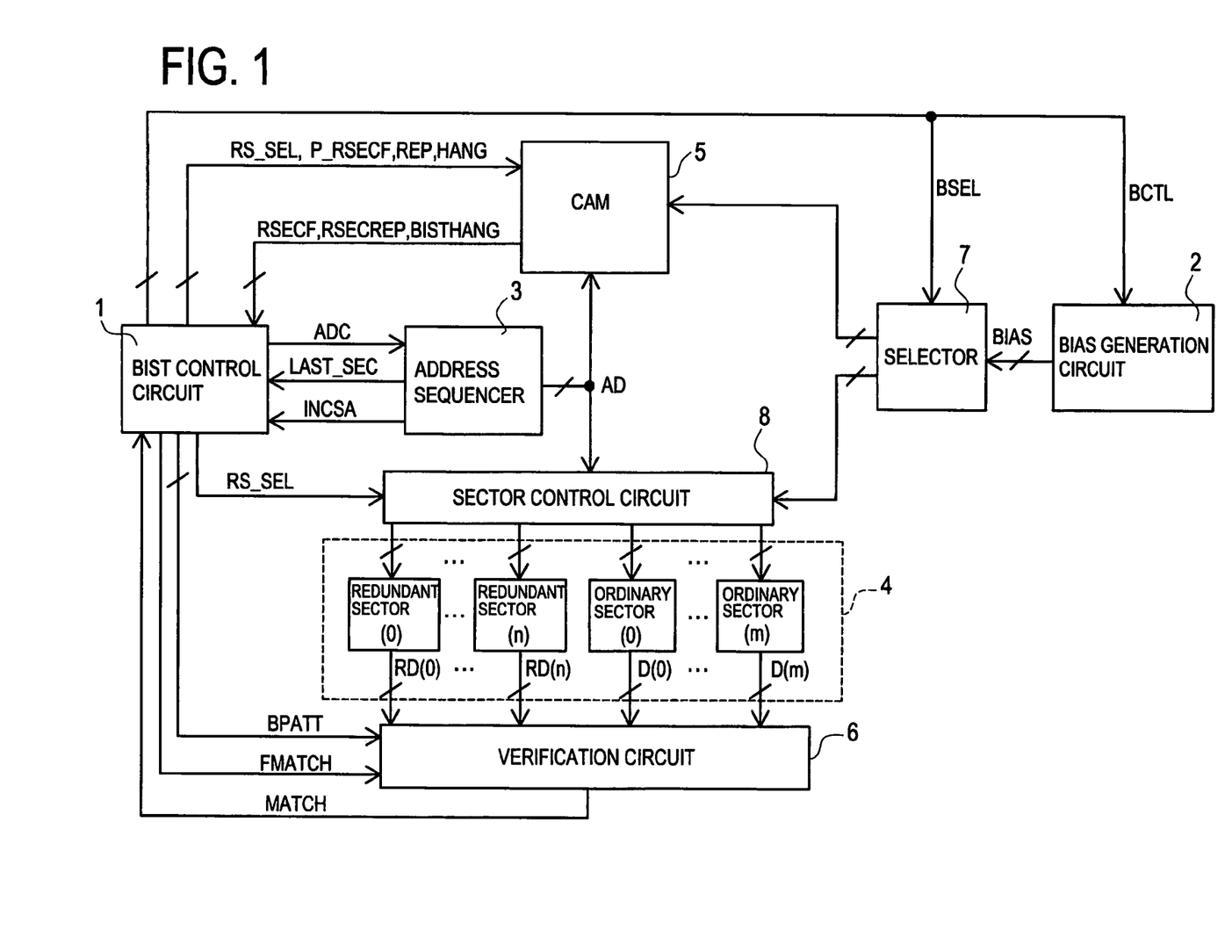
FIG. 1 is a circuit block diagram of a memory device in accordance with an embodiment of the present invention.

The circuit block diagram of the embodiment depicted in FIG. 1 pertains to a memory device in which a BIST function is incorporated, and describes mainly the circuit section that brings about the BIST function. A description of the circuit section pertaining to normal access operations is omitted.

A BIST control circuit 1 is a control circuit for controlling a self-test based on the BIST function. The BIST control circuit 1 outputs a bias control signal BCTL for controlling a bias generation circuit 2. The bias generation circuit 2 outputs a predetermined bias signal BIAS to a selector 7 in compliance with the bias control signal BCTL. The selector 7 outputs a bias signal BIAS to a CAM 5 and a sector control circuit 8 in compliance with a selector control signal BSEL. For example, in a nonvolatile memory device for storing data in accordance with accumulation and discharge of electric charge in a floating gate, a bias signal BIAS responsive to a deletion action (transition from data 0 to 1) and a program action (transition from data 1 to 0) is outputted in line with a control sequence by the BIST control circuit 1. Herein, the CAM 5 is composed of a nonvolatile memory. In accordance with the BIST function, usually, a writing action of a plurality of data patterns (checker pattern, reverse checker pattern, etc.,) and a reading action of written data are conducted in accordance with a configuration of the BIST control circuit 1. The bias signal BIAS is controlled and outputted in compliance with the data writing action (deletion action and program action) and reading action (verification action).

A memory cell array 4 is provided with ordinary sector (0) through ordinary sector (m), and redundant sector (0) through redundant sector (n) (m and n are natural numbers). The respective sectors are provided with a plurality of memory cells. The memory cells in the respective sectors are specified by an address signal AD. The address signal AD is provided with a sector address, a row address and a column address, etc. In addition, data D(0) through data D(m) are outputted from the ordinary sector (0) through ordinary sector (m) and are inputted into a verification circuit 6. Also, data RD(0) through data RD(n) are outputted from the redundant sector (0) through redundant sector (n), and are inputted into the verification circuit 6.

A data expectation value BPATT and a compulsory signal FMATCH, which are outputted from the BIST control circuit 1, are inputted into the verification circuit 6. Further, a match signal MATCH is outputted from the verification circuit 6 and is inputted into the BIST control circuit 1.

In the self-test based on the BIST function, an address signal AD is generated by the address sequencer 3 in compliance with an address control signal ADC from the BIST control circuit 1. The address signal AD outputted from the address sequencer 3 is inputted to the CAM 5 and the sector control circuit 8.

The address signal AD generated by the address sequencer 3 is an address signal for identifying memory spaces within the ordinary sector (0) through ordinary sector (m) of the memory cell array 4, accessible from the external by normal memory access actions. Although the redundant sector (0) through the redundant sector (n) are accessible if these sectors are replaced by redundancy recovery, in this case an access target is replaced with respect to input of an address signal for specifying the ordinary sector (0) through the ordinary sector (m), and it is common that input of an address signal for directly instructing the redundant sector (0) through the redundant sector (n) is impossible. Accordingly, the address sequencer 3 is also a circuit for generating an address signal similar to that which can be inputted from external to the memory device, wherein the address signal for directly specifying the redundant sector (0) through the redundant sector (m) is not generated.

The address control signal ADC is outputted from the BIST control circuit 1 and is provided to the address sequencer 3. Also, an extension sector enable signal RS_SEL is outputted from the BIST control circuit 1, and provided to the sector control circuit 8. The last sector flag signal LAST_SEC and sector address increment signal INCSA are outputted from the address sequencer 3, and provided to the BIST control circuit 1.

Figure 4:
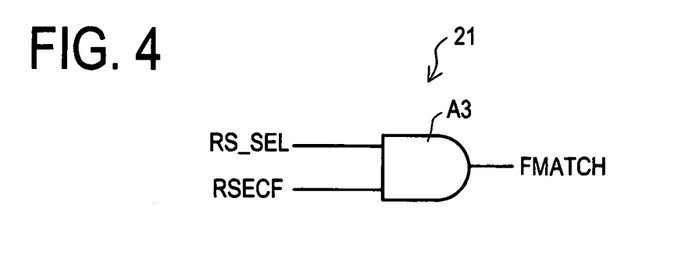
FIG. 4 is a circuit diagram of a pseudo signal outputting section 21 in accordance with the embodiment of the present invention.
Figure 5:
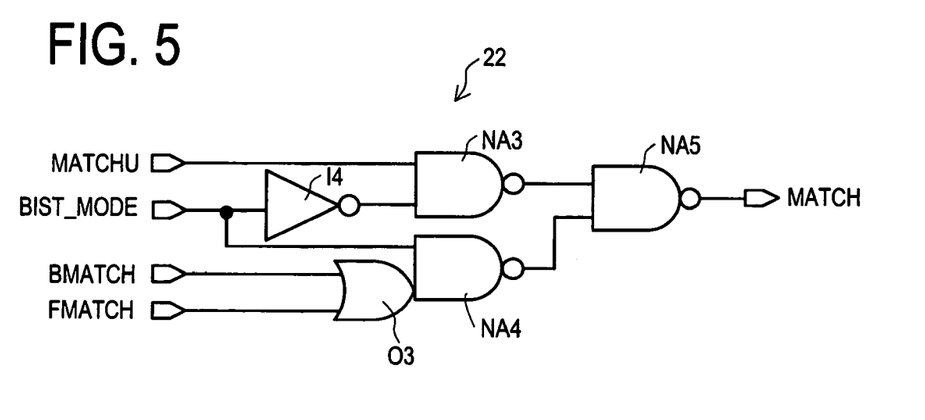
FIG. 5 is a circuit diagram of a match signal outputting section 22 in accordance with the embodiment of the present invention.
Figure 6:
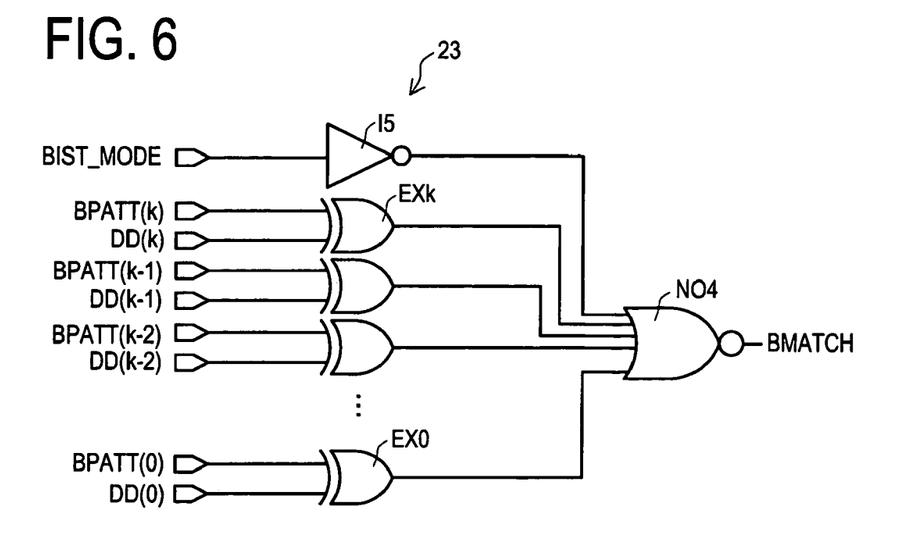
FIG. 6 is a circuit diagram of data comparison circuit 23 in accordance with the embodiment of the present invention.

During verification, data D(0) through data D(m) read from respective ordinary sectors of the memory cell array 4 and data RD(0) through RD(n) read from the redundant sectors thereof are received by the verification circuit 6. The read data is made into k-bit data. Also, data expectation value BPATT(0) through BPATT(k) outputted from the BIST control circuit 1 is also provided to the verification circuit 6. The verification circuit 6 is provided with a data comparison circuit 23 (FIG. 6). Each of data D(0) through data D(m) and data RD(0) through data RD(n) is selected one after another and is inputted into the data comparison circuit 23 as result data DD(0) through DD(k). The selected result data DD(0) through data DD(k) (where k is a number of I/O) are compared with the data expectation values BPATT(0) through BPATT(k) to determine whether or not they match each other. When both the result data and the data expectation values all match with each other, the data match signal BMATCH is set to a HIGH level, and a HIGH level match signal MATCH is outputted from a match signal outputting section 22 (FIG. 5) in compliance with the data match signal BMATCH being set to the HIGH level. The corresponding match signal MATCH is provided to the BIST control circuit 1. In accordance with the embodiment of the present invention, the BIST control circuit 1 is provided with an extension sector enable signal outputting section (FIG. 2) and a pseudo signal outputting section (FIG. 4).

Figure 2:
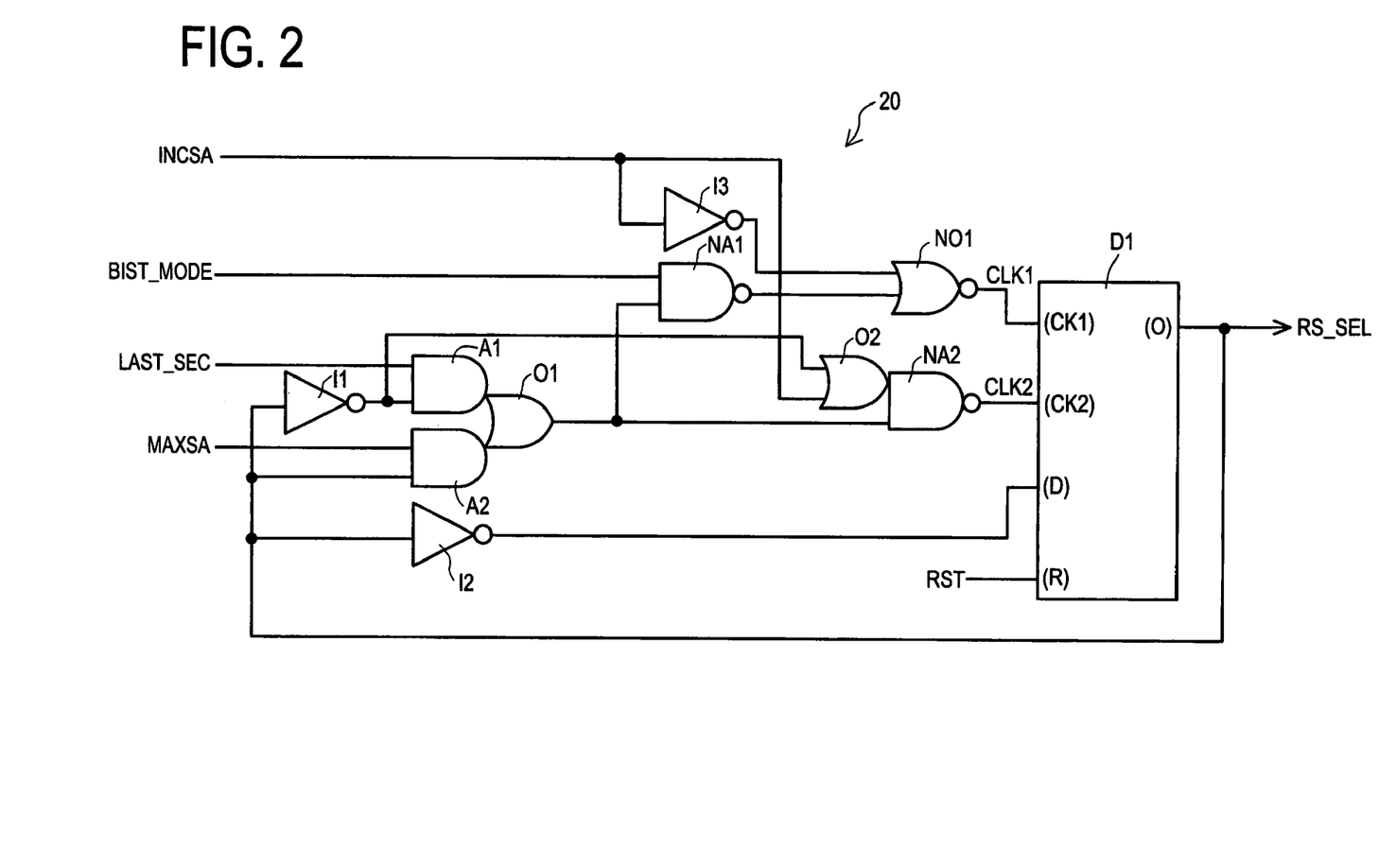
FIG. 2 is a circuit diagram of an extension sector enable signal outputting section 20 in accordance with the embodiment of the present invention.

FIG. 2 depicts an exemplar circuit of the extension sector enable signal outputting section 20 that generates an extension sector enable signal RS_SEL for outputting from the BUST control circuit 1 to the sector control circuit 8 (FIG. 1). Redundant sectors, not forming a memory space, to which an address signal is not allocated may be selected as a test target at the time of testing the corresponding redundant sector by using the extension sector enable signal RS_SEL.

A logic section is composed of AND gates A1 and A2, NAND gates NA1 and NA2, OR gates O1 and O2, NOR gate NO, and inverter gates I1 through I3. The extension sector enable signal RS_SEL outputted from a shift register D1 is inverted by the inverter gate I2 and is inputted into the D terminal of the shift register D1.

The extension sector enable signal RS_SEL outputted from the extension sector enable signal outputting section 20 is a test target control signal for switching a test target between ordinary sectors and redundant sectors. The extension sector enable signal RS_SEL transits to a HIGH level when the test target is a redundant sector, and transits to a LOW level when the test target is an ordinary sector.

Figure 3:
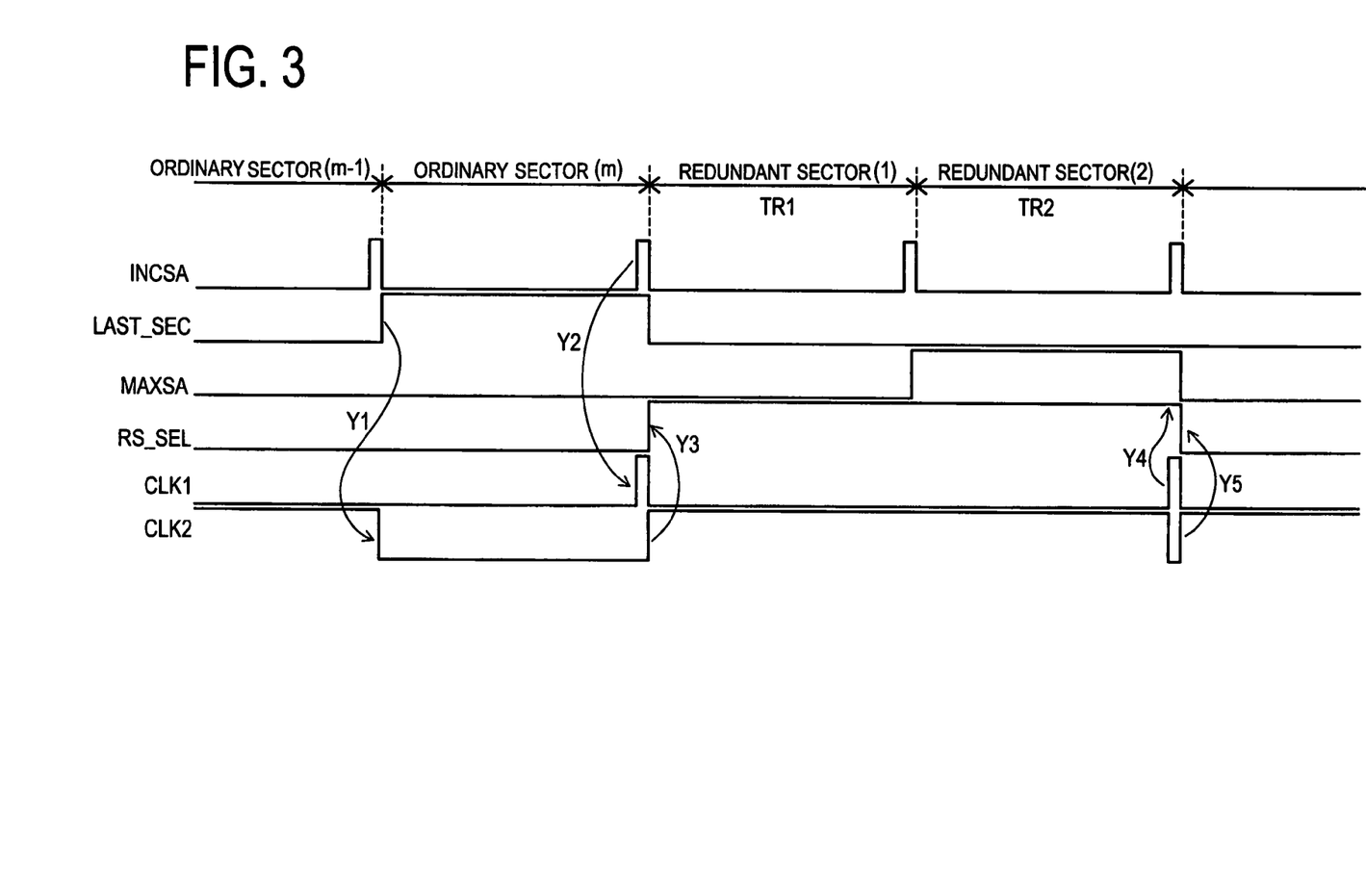
FIG. 3 is an operation waveform diagram of the extension sector enable signal outputting section 20 in accordance with the embodiment of the present invention.

A description is given of actions of the extension sector enable signal outputting section 20 using the waveforms of FIG. 3. A description is given of a case where the memory cell array 4 is provided with m ordinary sectors (ordinary sectors (1) through (m)) and two redundant sectors (redundant sectors (1) and (2)). The sector address increment signal INCSA switches a sector to be selected, and the sector address increment signal INCSA is at a HIGH level for the period during which access is made to the memory cell of the last address in the respective sector. When access to the cell of the last address is terminate, and the sector address increment signal INCSA is reset to a LOW level, the sector for access is switched by the falling edge of the signal INCSA.

The ordinary sectors are selected one by one in the order of the ordinary sectors (1) through (m), and each sector is tested. The NAND gate NA2 (FIG. 2) outputs a LOW level clock signal CLK2 where both the OR gates O1 and O2 are at a HIGH level. The OR gate O1 outputs a HIGH level signal when the output signal of at least any one of the AND gates A1 and A2 is at a HIGH level. When the ordinary sector (m), which is the last sector of the ordinary sectors, is selected, the last sector flag signal LAST_SEC is set to a HIGH level. The output of the AND gate A1 is at a HIGH level in compliance with the last sector flag signal LAST_SEC transiting to the HIGH level, and the output of the OR gate O1 is set to a HIGH level. Also, at this time, the output of the OR gate O2 transits to a HIGH level. Therefore, the clock signal CLK2 which is an output signal of the NAND gate NA2 transits to a LOW level (Arrow Y1).

If, in the ordinary sector (m) of the last sector, the cell array of the last address is accessed, the sector address increment signal INCSA transits to a HIGH level. The clock signal CLK1 outputted from the NOR gate NO1 transits to a HIGH level where the clock signal CLK2 is at a LOW level and the sector address increment signal INCSA is at a HIGH level. Therefore, the clock signal CLK1 rises in compliance with the rise of the sector address increment signal INCSA (Arrow Y2) and the inverted signal (at a HIGH level) of the extension sector enable signal RS_SEL is taken into the shift register D1.

Next, based on completion of the test of the ordinary sector (m), the last sector flag signal LAST_SEC falls, and the clock signal CLK2 rises. The shift register D1 then outputs the HIGH level signal, which was taken in, as an extension sector enable signal RS_SEL in compliance with the rise of CLK2 (Arrow Y3). Accordingly, the test period of the ordinary sectors is finished and the test period of redundant sectors is commenced.

For the periods TR1 and TR2, the redundant sectors are tested in the order of (1) and (2). Since the period TR2 tests the redundant sector (2) which is the last redundant sector, the last extension sector informing signal MAXSA, which informs that the last redundant sector is being tested, is set to a HIGH level. The last extension sector informing signal MAXSA is generated in the BIST control circuit 1. The inverted signal (at a LOW level) of the extension sector enable signal RS_SEL is taken into the shift register D1 in compliance with the rise of the clock signal CLK1 (Arrow Y4). Next, the last extension sector informing signal MAXSA falls in compliance with completion of testing the redundant sector (2) and the clock signal CLK2 rises. Then, the shift register D1 (FIG. 2) outputs the LOW level signal, which was taken in, as an extension sector enable signal RS_SEL based on the rise of the clock signal CLK2 (Arrow Y5).

A description will now be given of the effects of the extension sector enable signal outputting section 20. The extension sector enable signal RS_SEL is inputted into the CAM 5 and the sector control circuit 8. For the period during which the extension sector enable signal RS_SEL is at a HIGH level, it is provided to the CAM 5 and the sector control circuit 8 signaling that the period is for testing the redundant sectors. Therefore, for the period during which the extension sector enable signal RS_SEL is at a HIGH level, the sector control circuit 8 permits efffective access to the redundant sectors. Therefore, the address signal AD for identifying the ordinary sectors can then be used to identify the redundant sectors. That is, at the time of testing the redundant sectors, with respect to redundant sectors, not forming a memory space at the time of normal access, to which an address signal for identifying an ordinary sector is not allocated, it is possible to select a redundant sector as a test target by the extension sector enable signal RS_SEL. Accordingly, at the time of testing the redundant sectors, it is not necessary to input a test signal from external to the memory device; instead it is possible to conduct a test of the redundant sectors by a built-in self-test function, and it is not necessary to provide any exclusive input terminal for such purpose. At the time of testing the redundant sectors, it is also not necessary to carry out any control such as inputting a test signal from external to the memory device, wherein it is possible to conduct a test of the redundant sectors by the built-in self-test function.

A description will now be given of the pseudo signal outputting section 21 (FIG. 4) in which is a portion of the BIST control circuit 1. The extension sector enable signal RS_SEL and defective redundant sector signal RSECF are inputted into the AND gate A3 that forms the pseudo signal outputting section 21. The defective redundant sector signal RSECF is a signal identifying a redundant sector for which the test result is defective. For the period during which the extension sector enable signal RS_SEL is at a HIGH level (that is, a test period of the redundant sectors), a compulsory signal FMATCH is brought to a HIGH level where the defective redundant sector signal RSCEF is at a HIGH level (indicating that a selected redundant sector is a defective sector).

A description will next be given of a match signal outputting section 22 (FIG. 5) and a data comparison circuit 23 (FIG. 6), which are provided in the verification circuit 6. FIG. 5 shows a circuit example of the match signal outputting section 22 that outputs a match signal MATCH brought to a HIGH level when the read data and the data expectation value match each other. The logic section is composed of NAND gates NA3 through NA5, an OR gate O3 and an inverter gate I4. The ordinary mode match signal MATCHU is a signal for outputting a data comparison result during normal operations other than the BIST mode.

The mode signal BIST_MODE is brought to a HIGH level for the period of the BIST mode operation, and the output of the NAND gate NA3 is fixed at a HIGH level. Therefore, the ordinary mode match signal MATCHU is masked by the NAND gate NA3 for the period of the BIST mode. The data match signal BMATCH is brought to a HIGH level, as described later, when the real data read result data DD and the data expectation value BPATT match each other during the BIST mode. The compulsory signal FMATCH is brought to a HIGH level when the selected redundant sector is a defective sector for the period during which the extension sector enable signal RS_SEL is at a HIGH level (that is, during a test period of the redundant sector).

The output of the OR gate O3 is brought to a HIGH level when at least one of the data match signal BMATCH and the compulsory signal FMATCH is at a HIGH level. Since the mode signal BIST_MODE which is at a HIGH level at all times is inputted in the NAND gate NA4 for the period of the BIST mode, the NAND gate NA4 acts as an inverter. Therefore, the match signal MATCH that is output from the NAND gate NA5 is brought to a HIGH level when at least one of the data match signal BMATCH and the compulsory signal FMATCH is at a HIGH level.

FIG. 6 shows a circuit example of the data comparison circuit 23 that outputs a data match signal BMATCH. The data match signal BMATCH is a signal for informing, on the basis of comparison of the data expectation value BPATT with the result data DD(0) through DD(k) (k is a number of I/Os), that both match each other during the period of the BIST mode. The logic section is composed of exclusive OR gates EX0 through EXk, an inverter gate I5, and a NOR gate NO4. The mode signal BIST_MODE is inputted into the NOR gate NO4 via the inverter gate I5. Similarly, the result data DD(0) through DD(k) and the data expectation values BPATT(0) through BPATT(k) are inputted into the NOR gate NO4 via the exclusive OR gates EX0 through EXk. The data match signal BMATCH is brought to a HIGH level when, for the period of the BIST mode (while the mode signal BIST_MODE is at a HIGH level), respective data of the result data DD(0) through DD(k) are matched to all of the respective data expectation values BPATT(0) through BPATT(k).

Figure 7:
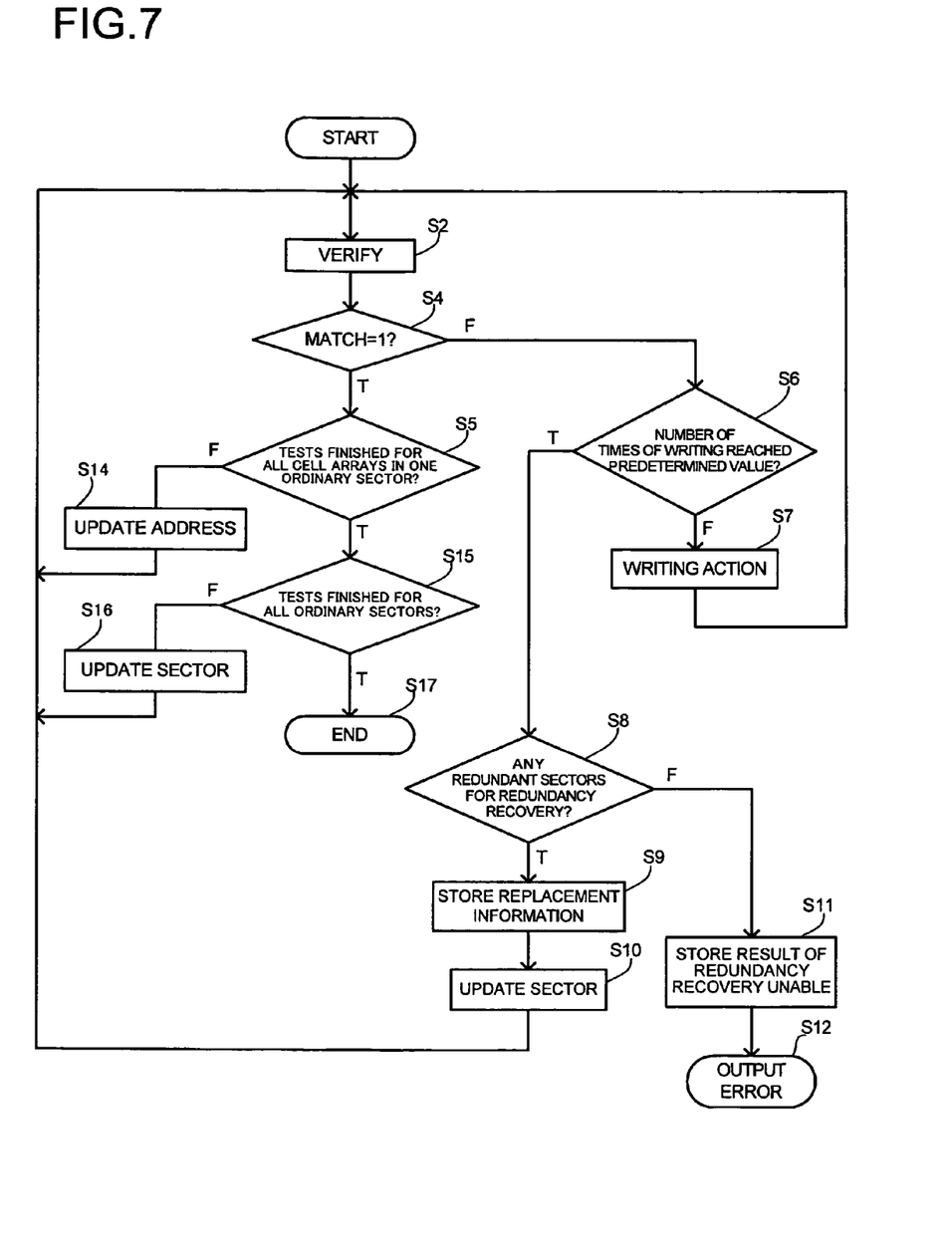
FIG. 7 is an operation flowchart depicting a method for testing an ordinary sector in accordance with the embodiment of the present invention.
Figure 8:
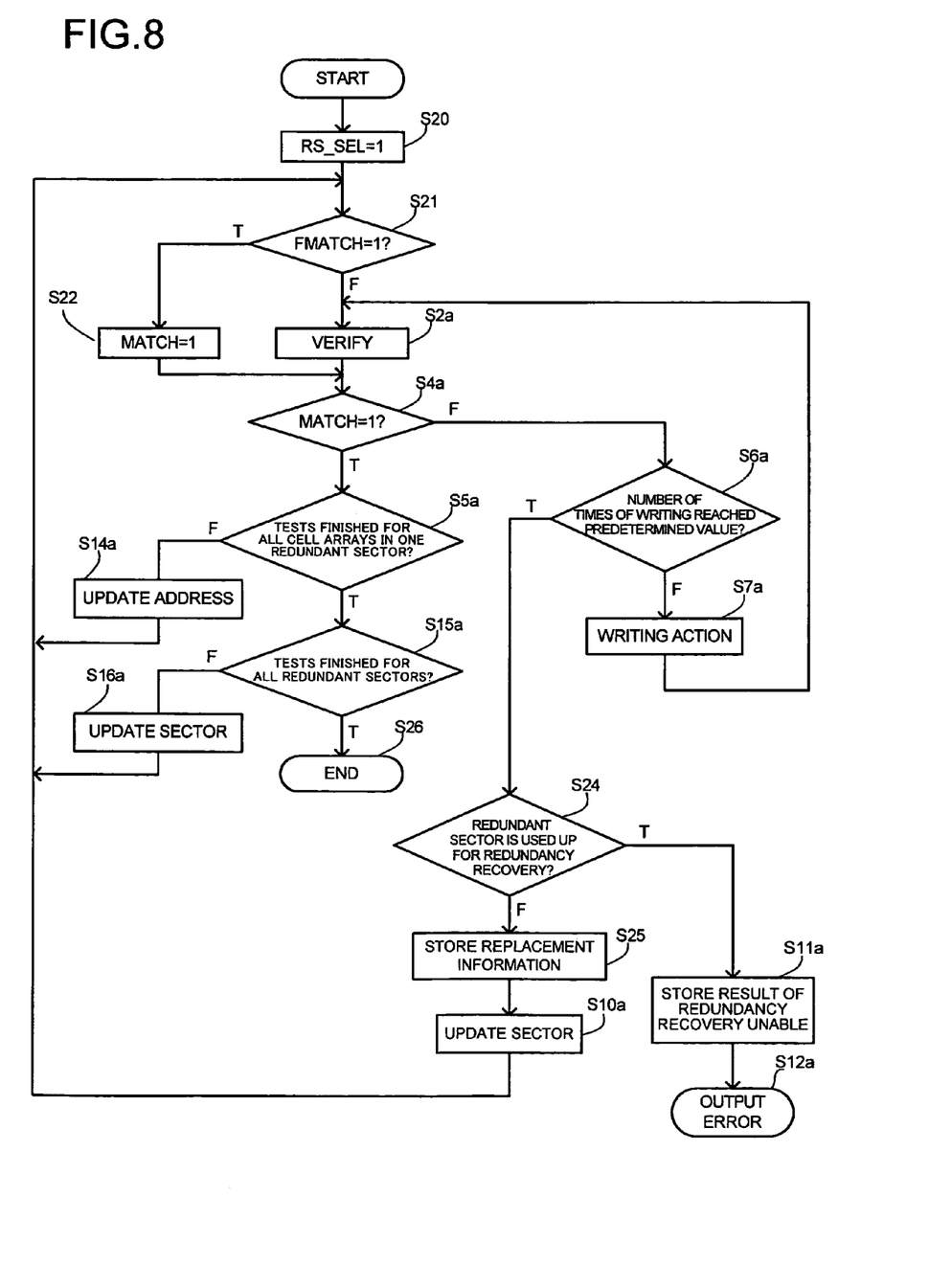
FIG. 8 is an operation flowchart depicting a method for testing a redundant sector in accordance with the embodiment of the present invention.

Referring to the flowcharts of FIGS. 7 and 8, a description will be given of a method for setting redundancy in accordance with the embodiment of the present invention. In accordance with the BIST function, usually, writing of data (deletion action and program action) and reading of written data (verification action) are carried out with respect to a plurality of data patterns. Accordingly, writing into ordinary sectors and writing into redundant sectors are carried out with respect to one data pattern. After that, reading of the ordinary sectors and reading of the redundant sectors are carried out, and the writing and reading are carried out for each of the test patterns. The writing action may not be completed during one cycle, but may require writing a predetermined number of times in compliance with the type of a nonvolatile memory device and various types of specifications. FIG. 7 is a flowchart depicting a case where an ordinary sector is selected during the writing and reading, and FIG. 8 is a flowchart depicting a case where a redundant sector is selected therein. In accordance with the embodiment of the present invention, a description is given of a case where the redundant sector is tested following the test of the ordinary sector.

Referring to the flowchart of FIG. 7, a description is given of a case where a writing test for writing a predetermined data pattern is carried out. The mode signal BIST_MODE is brought to a HIGH level for the period of the BIST mode operation. First, a verification action of the ordinary sector is commenced (S2). Based on the result of the verification action, the data comparison circuit 23 provided in the verification circuit 6 determines whether or not the read result data DD(0) through DD(k) are matched to the data expectation values BPATT(0) through BPATT(k)(S4). And, if these data match each other, the data match signal BMATCH is brought to a HIGH level. When the data match signal BMATCH is brought to a HIGH level, the match signal MATCH outputted from the match signal outputting section 22 (FIG. 5) is set to "1" (HIGH level) (S4:T). Therefore, the process advances to S5, wherein it is determined whether or not testing is finished with respect to all the cell arrays that are test targets in the ordinary sectors.

On the other hand, where it is determined that the read data DD and the data expectation value BPATT do not completely match each other (S4:F), it is determined whether or not the number of times of writing data has reached a predetermined value (S6). Unless the number of times of writing reaches the predetermined value (S6:F), a writing action is carried out again (S7), and the process is returned to the verification action (S2). Where the number of times of writing reaches the predetermined value (S6:T), it is determined that the corresponding sector is a defective sector for writing, wherein it is necessary to perform redundancy recovery.

First, it is determined whether or not there remain any redundant sectors that are not yet used for redundancy recovery (S8). At this time, when a redundancy hang signal BISTHANG inputted from the CAM 5 into the BIST control circuit 1 is at a HIGH level, it means that the redundancy has been used up, and redundancy recovery is no longer effective (S8:F). Thus, the BIST control circuit 1 informs the CAM 5 via the redundancy recovery hang signal HANG that the BIST result has become defective, and the information that the BIST result is defective is stored in the CAM 5 (S11). Also, this information is outputted, as an error, to external of the memory device via the CAM 5 (S12).

Where the redundancy hang signal BISTHANG received from the CAM 5 by the BIST control circuit 1 is at a LOW level, it means that the redundancy has not been used up, wherein redundancy recovery is still possible (S8:T). Therefore, replacement information REP is stored in the CAM 5, replacing a defective sector by a redundant sector (S9). And, after the sector is updated (S10), the process is returned to the verification action (S2).

At step S5, it is determined whether or not tests are finished for all the cell arrays that are test targets in one ordinary sector. Where the tests are not finished for all the cell arrays (S5:F), the address is updated (S14), and the process is returned to the verification action (S2). Where the tests are finished for all the cell arrays (S5:T), it is determined whether or not tests are finished for all the sectors in the memory cell array 4 (S15). Where the tests are not finished for all the sectors (S15:F), the sector is updated, and the process is returned to the verification action (S2). Where the tests are finished for all the sectors (S15:T), the tests in the ordinary sectors are terminated (S17). Subsequently, reading of redundant sectors is carried out (FIG. 8).

Referring to FIG. 8, a description is next given of a flowchart where a redundant sector is selected. Initially, the extension sector enable signal is set to "1" (that is, RS_SEL=1) (S20), switching the test target from an ordinary sector to a redundant sector. Accordingly, it is possible to select a redundant sector as a test target by the extension sector enable signal RS_SEL and, when testing a redundant sector, not forming any memory space with respect thereto to which an address signal for identifying an ordinary sector is not allocated in the normal access.

First, it is determined on the basis of the information of defective redundant sectors, which is stored in the CAM 5, whether or not the redundant sector selected is a defective sector. If it is once determined, during the verification of the previous test pattern, that the redundant sector is a defective sector, since verification is carried out with respect to a plurality of test patterns, the address information AD of defective sectors has been stored in the CAM 5. Thus, when the address information AD of the redundant sector selected at present is provided from the address sequencer 3 to the CAM 5, it is determined, in the CAM 5, whether or not the redundant sector selected and the address of the defective sector stored are matched to each other. Where these are matched to each other, it is recognized that the redundant sector selected at present is a defective sector. In this case, the result is provided by the defective redundant sector signal RSECF, which is at a HIGH level, provided from the CAM 5 to the pseudo signal outputting section 21 (FIG. 4) of the BIST control circuit 1.

The pseudo signal outputting section 21 (FIG. 4) outputs a HIGH level compulsory signal FMATCH since a HIGH level defective redundant sector signal RSECF is inputted. Where the compulsory FMATCH is at a HIGH level (S21: T), the match signal MATCH outputted from the match signal outputting section 22 (FIG. 5) provided in the verification circuit 6 is forcedly brought to a HIGH level (S22). Accordingly, the verification action (S2a) is skipped. That is, the defective sector is controlled so that no verification is carried out.

On the other hand, where the compulsory signal FMATCH is at a LOW level (S21:F), since the selected redundant sector is a normal sector, a verification action is carried out (S2a). If it is determined on the basis of the result of the verification action that the read data DD and the data expectation value BPATT are not completely matched to each other (S4a:F), it is determined whether or not the number of times of writing reaches the predetermined value (S6a). Unless the number of times of writing reaches the predetermined value (S6a:F), a writing action is carried out again (S7a), and the process is returned to the verification action (S2a). If the number of times of writing reaches the predetermined value (S6a:T), it is determined that the corresponding redundant sector is a defective sector.

First, it is determined whether or not the redundant sector which is determined to be a defective sector has been used for redundancy recovery (S24). At this time, where replaced information RSECREP, which is inputted from the CAM 5 into the BIST control circuit 1, is at a HIGH level, it means that the redundant sector has already been used for redundancy recovery (S24:T) and, as the redundant sector is defective, the redundancy recovery is no longer effective. Therefore, the redundancy recovery hang signal HANG provided from the BIST control circuit 1 to the CAM 5 informs the CAM that the BIST result is defective. The information that the BIST result is defective is stored in the CAM 5 (S11a), and is also outputted as an error (S12a) external to the memory device via the CAM 5.

Where the replaced information RSECREP, which is provided from the CAM 5 to the BIST control circuit 1 is at a LOW level, it means that the redundant cell which is now under testing is not yet used for redundancy recovery (S24:F). Therefore, with the defective redundant sector writing signal P_RSECF, the address signal AD of the defective sector is stored as information of the defective redundant sector (S25) and, after the sectors are updated (S10a), the process is returned to a confirmation action (S21) of the compulsory signal FMATCH.

At step S5a, it is determined whether or not tests are finished for all the cell arrays that are test targets in one redundant sector. Where the tests are not finished for all the cell arrays, the address is updated (S14a), and the process is returned to the verification action (S21). Where the tests are finished for all the cell arrays, it is determined whether or not tests are finished for all the redundant sectors in the memory cell array 4 (S15a). Where the tests are not finished for all the redundant sectors, the sector is updated (S16a), and the process is returned to the verification action (S21). Where the tests are finished for all the sectors (S15a:T), testing is terminated for the redundant sectors (S26).

Therefore, as depicted in the flowchart of FIG. 8, during normal access operations, it is possible to select a redundant sector as a test target by the extension sector enable signal RS_SEL; and, when testing the redundant sectors, with respect to those redundant sectors not forming any memory space, it is possible to select a redundant sector as a test target to which an address signal for identifying ordinary sectors is not allocated. Therefore, the address signal AD for identifying the ordinary sectors may be utilized for identification of redundant sectors and it is not necessary to issue a special command to access the redundant sectors. Accordingly, at the time of testing the redundant sectors, it is not necessary to carry out any control such as inputting a test signal from external to the memory device; instead it is possible in accordance with the embodiment of the present invention to conduct a test of the redundant sectors by the built-in self-test function.

Thus, in a case where the BIST is conducted with respect to a plurality of data patterns, for the redundant sectors which are once recognized to be defective sectors, it is possible to skip tests for the subsequent data patterns, and surplus stress application can be prevented. Therefore, it is possible to shorten the test time.

By the defect information for addresses of the defective redundant sectors being retained in the CAM, it is possible to recognize the defective sectors when carrying out verification. Accordingly, when a target sector is recognized to be a defective sector when carrying out verification, it is forcedly informed that the verification is normal, whereby it is possible to skip the verification action. That is, the verification action of the defective sectors can be skipped without varying control of the address sequencer and the situation of detecting a known defective sector during the redundant sectors can be prevented. Thereby, it is possible to prevent the situation where the entire memory device is regarded to be defective, resulting from occurrence of a defect in redundant sectors which do not influence the quality judgement of the memory device. Accordingly, it is possible to reduce such situations in which a normal semiconductor device is erroneously judged to be defective, thus preventing the yield from being lowered. Furthermore, complicated judgments are no longer required, whereby after determining whether or not a detected defective sector is a redundant sector, it must then be determined that the entire semiconductor device is normal if the defective sector is only a redundant sector.

Also, the extension sector enable signal RS_SEL is one example of a test target control signal, the ordinary sector is one example of a ordinary memory block, the redundant sector is one example of a redundant memory block, the CAM is one example of a storage section, and the last sector flag signal LAST_SEC is one example of a last address signal, respectively.

In addition, the invention is not limited to the above-described embodiment, and it is obvious to those skilled in the art that the invention may be subject to various improvements and modifications within the scope of the present invention without departing from the spirit of the invention. The embodiment is constructed so that, where a defective sector is detected in the redundant sectors, the verification action is skipped for the corresponding defective sector. However, the invention is not limited thereto. Where a defective sector is detected in the ordinary sectors, the verification action may be skipped for the corresponding defective sector, thereby preventing surplus stress application and making it possible to further shorten the test time.

Also, in the present embodiment, it is assumed that the redundant sectors are tested following the tests of ordinary sectors. However, the invention is not limited thereto. The test of ordinary sectors may be conducted following the redundant sectors. That is, the flow depicted in FIG. 8 is first conducted and, where a defect is detected in the redundant sectors, the flow is terminated (S26) after the information of defective redundant sectors is stored in the CAM (S25). Next, the test flow (FIG. 7) of the ordinary sectors is commenced with the extension sector enable signal RS_SEL set to 0 (that is, RS_SEL=0). Then, if a defective sector is detected (S6:T), it is determined whether or not there remain any redundant sectors that are not yet used for redundancy recovery (S8). At this time, the redundant sectors which are defective may not be used for redundancy recovery on the basis of the information of defective redundant sectors. Therefore, after it is confirmed whether or not the redundant sectors are defective, the redundant sectors free from any defect may be selectively used for the redundancy recovery. Accordingly, it becomes possible that the success probability of redundancy recovery can be increased, and it becomes possible to increase the yield of the semiconductor devices.

Also, in accordance with the present embodiment, a description was given of redundancy recovery in which a so-called sector redundancy is used as the unit of redundancy. The invention is not limited thereto. A bit line or a bit line group which is called "column redundancy" may be used as the unit of redundancy. Also, it is considered that a plurality of redundancy recoveries may be carried out with these redundancy units combined, wherein it is possible to recover a number of defective bits with only a fewer number of redundancy cells.

What is claimed is:

1. A method for testing a memory device that includes an ordinary memory block and a redundant memory block and conducts a test by using a built-in self-testing function, the method comprising the steps of:
   generating an address signal for identifying the ordinary memory block and contents thereof;
   identifying the ordinary memory block and contents thereof in response to the address signal during the test of the ordinary memory block;
   outputting a test target control signal for selecting the redundant memory block as the test target in response to the address signal transiting from an address which identifies a last test target in the ordinary memory block;
   selecting the redundant memory block as a test target in the test by the built-in self-testing function in response to the test target control signal; and
   identifying the redundant memory block and contents thereof in accordance with the address signal after the step of selecting the redundant memory block as the test target.

2. The method for testing the memory device in accordance with claim 1, wherein the address signal is a signal for identifying a memory space formed by the ordinary memory block at a time of normal access.

3. The method for testing the memory device in accordance with claim 1, further comprising the step of storing identifying information on the redundant memory block identified in accordance with the address signal when the redundant memory block is defective as determined from a result of the test of the redundant memory block.

4. The method for testing the memory device in accordance with claim 3 further comprising the step of outputting a pseudo test result showing that the redundant memory block has no defect during the test of the redundant memory block on which the identifying information is stored, without conducting a write operation for test data.

5. The method for testing the memory device in accordance with claim 1 further comprising the step of, when the ordinary memory block is defective as determined from a result of the test of the ordinary memory block, storing the identifying information on the ordinary memory block identified in response to the address signal and setting replacement of the ordinary memory block with the redundant memory block.

6. The method for testing the memory device in accordance with claim 5 further comprising the steps of:
   storing the identifying information on the redundant memory block when the redundant memory block is determined to be defective as a result of the test of the redundant memory block; and
   providing an error when the redundant memory block set in the replacement setting step is the redundant memory block on which identifying information is stored during the step of storing identifying information on the redundant memory block.

7. A method for testing a memory device that includes an ordinary memory block and a redundant memory block and conducts a test by using a built-in self-testing function, the method comprising the steps of:
   generating an address signal for identifying the ordinary memory block and contents thereof;
   outputting a test target control signal;

selecting the redundant memory block as a test target in the test by the built-in self-testing function in response to the test target control signal;

identifying the redundant memory block and contents thereof in accordance with the address signal;

outputting the test target control signal for selecting the ordinary memory block as the test target in response to the address signal transiting from an address which identifies a last test target in the redundant memory block; and identifying the ordinary memory block and contents thereof in response to the address signal during the test of the ordinary memory block.

8. The method for testing the memory device in accordance with claim 6, wherein the error providing step includes providing an error in response to the redundant memory block set in the replacement setting step being defective as determined as a result of the test of the redundant memory block.

9. A memory device that includes an ordinary memory block and a redundant memory block and conducts a test by using a built-in self-testing function, the memory device comprising:

an address sequencer which generates an address signal for identifying the ordinary memory block and contents thereof; and a test target control section which outputs a test target control signal for substituting identification of the redundant memory block and contents thereof for the address signal during the test of the redundant memory block, the test target control section outputting the test target control signal in response to the address signal transiting from a last address signal in the ordinary memory block by the address sequencer in the case where the test of the redundant memory block is conducted following the test of the ordinary memory block.

10. The memory device in accordance with claim 9 further comprising:

a storage section which stores identifying information on the redundant memory block that is defective as determined as a result of the test; and a pseudo signal outputting section which outputs a pseudo test result showing that the redundant memory block on which the identifying information is stored in the storage section is normal and has no defect in response to the stored identifying information.

11. The method for testing the memory device in accordance with claim 7, wherein the address signal is a signal for identifying a memory space formed by the ordinary memory block at a time of normal access.

12. The method for testing the memory device in accordance with claim 7 further comprising the step of storing identifying information on the redundant memory block identified in accordance with the address signal when the redundant memory block is defective as determined from a result of the test of the redundant memory block.

13. The method for testing the memory device in accordance with claim 12 further comprising the step of outputting a pseudo test result showing that the redundant memory block has no defect during the test of the redundant memory block on which the identifying information is stored, without conducting a write operation for test data.

14. The method for testing the memory device in accordance with claim 7 further comprising the step of, when the ordinary memory block is defective as determined from a result of the test of the ordinary memory block, storing the identifying information on the ordinary memory block identified in response to the address signal and setting replacement of the ordinary memory block with the redundant memory block.

15. The method for testing the memory device in accordance with claim 14 further comprising the steps of:

storing the identifying information on the redundant memory block when the redundant memory block is determined to be defective as a result of the test of the redundant memory block; and providing an error when the redundant memory block set in the replacement setting step is the redundant memory block on which identifying information is stored during the step of storing identifying information on the redundant memory block.

16. The method for testing the memory device in accordance with claim 15, wherein the error providing step includes providing an error in response to the redundant memory block on which the identifying information is stored in the step of storing identifying information on the redundant memory block being set in the replacement setting step.

* * * * *